(12) United States Patent
Bao et al.

(10) Patent No.: US 10,115,607 B2
(45) Date of Patent: Oct. 30, 2018

(54) METHOD AND APPARATUS FOR WAFER OUTGASSING CONTROL

(71) Applicant: Applied Materials, Inc., Santa Clara, CA (US)

(72) Inventors: Xinyu Bao, Fremont, CA (US); Chun Yan, San Jose, CA (US); Hua Chung, San Jose, CA (US); Schubert S. Chu, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 228 days.

(21) Appl. No.: 15/267,232

(22) Filed: Sep. 16, 2016

(65) Prior Publication Data

US 2018/0082874 A1   Mar. 22, 2018

(51) Int. Cl.
  *B65B 31/00* (2006.01)
  *H01L 21/67* (2006.01)
  *H01L 21/673* (2006.01)
  *H01L 21/677* (2006.01)

(52) U.S. Cl.
  CPC ............ *H01L 21/67* (2013.01); *H01L 21/673* (2013.01); *H01L 21/677* (2013.01); *H01L 21/67393* (2013.01)

(58) Field of Classification Search
  CPC . H01L 21/67; H01L 21/673; H01L 21/67393; H01L 21/677
  See application file for complete search history.

(56) References Cited

U.S. PATENT DOCUMENTS

| 6,558,962 B2 | 5/2003 | Nishiki |
| 2005/0111935 A1 | 5/2005 | Kim et al. |
| 2009/0181548 A1 | 7/2009 | Takahashi et al. |
| 2009/0191499 A1 | 7/2009 | Surthi et al. |
| 2012/0083918 A1 | 4/2012 | Yamazaki |

FOREIGN PATENT DOCUMENTS

WO   2005-078771 A2   8/2005

OTHER PUBLICATIONS

International Search Report and Written Opinion for International Application No. PCT/US2017/050128 dated Dec. 21, 2017.

*Primary Examiner* — Jason K Niesz
(74) *Attorney, Agent, or Firm* — Patterson + Sheridan LLP

(57) ABSTRACT

Embodiments disclosed herein generally relate to apparatus and methods for controlling substrate outgassing such that hazardous gasses are eliminated from a surface of a substrate after a Si:As process has been performed on a substrate, and prior to additional processing. The apparatus includes a purge station including an enclosure, a gas supply coupled to the enclosure, an exhaust pump coupled to the enclosure, a first purge gas port formed in the enclosure, a first channel operatively connected to the gas supply at a first end and to the first purge gas port at a second end, a second purge gas port formed in the enclosure, and a second channel operatively connected to the second purge gas port at a third end and to the exhaust pump at a fourth end. The first channel includes a particle filter, a heater, and a flow controller. The second channel includes a dry scrubber.

20 Claims, 3 Drawing Sheets

METHOD AND APPARATUS FOR WAFER OUTGASSING CONTROL

BACKGROUND

Field of the Disclosure

Embodiments of the present disclosure generally relate to the fabrication of integrated circuits. More specifically, embodiments disclosed herein relate to methods and apparatus for controlling substrate outgassing.

Description of the Related Art

The manufacture of modern logic, memory, or integrated circuits typically requires more than four hundred process steps. A number of these steps are thermal processes that raise the temperature of the semiconductor substrate to a target value to induce rearrangement in the atomic order or chemistry of thin surface films (e.g., diffusion, oxidation, recrystallization, salicidation, densification, flow).

Ion implantation is a method for the introduction of chemical impurities in semiconductor substrates to form the p-n junctions necessary for field effect or bipolar transistor fabrication. Such impurities include P-type dopants, such as boron, aluminum, gallium, beryllium, magnesium, and zinc, and N-type dopants such as phosphorus, arsenic, antimony, bismuth, selenium, and tellurium. Ion implantation of chemical impurities disrupts the crystallinity of the semiconductor substrate over the range of the implant. At low energies, relatively little damage occurs to the substrate. However, the implanted dopants will not come to rest on electrically active sites in the substrate. Therefore, an anneal is required to restore the crystallinity of the substrate and drive the implanted dopants onto electrically active crystal sites.

During the processing of the substrate in, for example, an RTP chamber, the substrate may tend to outgas impurities implanted therein. These outgassed impurities may be the dopant material, a material derived from the dopant material, or any other material that may escape the substrate during the annealing process, such as the sublimation of silicon. The outgassed impurities may deposit on the colder walls and other members of the chamber. This deposition may interfere with temperature sensor readings and with the radiation distribution fields on the substrate, which in turn affects the temperature at which the substrate is annealed. Deposition of the outgassed impurities may also cause unwanted particles on the substrates and may also generate slip lines on the substrate. Depending on the chemical composition of the deposits, the chamber is taken offline for a wet clean process to remove the deposits.

A major challenge in some semiconductor processes relates to arsenic outgassing from substrates after arsenic doped silicon processes (Si:As). In such arsenic doped silicon processes the arsenic outgassing from the substrates is higher, for example 2 parts per billion per substrate, than the arsenic outgassing from substrates after a III-V epitaxial growth process and/or an etch clean process (e.g., a CMOS, FinFET, TFET process), for example 0.2 parts per billion per substrate. Previous cycle purge approaches developed for III-V epitaxial growth process and/or etch clean processes are not effective for Si:As processed substrates. Testing has been performed on the prior known III-V methods, apparatus, and results indicate that outgassing levels are not altered after ten cycles of pump/purge, as arsenic outgassing was still detected at about 2.0 parts per billion.

Absolute zero parts per billion (ppb) outgassing is typically desired for arsenic residuals due to arsenic toxicity. To minimize toxicity from arsenic outgassing during subsequent handling and processing of substrates, there is a need for an improved method and apparatus for controlling substrate outgassing for Si:As processed substrates.

SUMMARY

Embodiments disclosed herein generally relate to apparatus and methods for semiconductor processing that control substrate outgassing such that hazardous gasses are eliminated from a surface of a substrate after an Si:As process and prior to additional processing. In one embodiment, an semiconductor processing system is disclosed. The system includes a purge station. The purge station includes an enclosure, a gas supply coupled to the enclosure, an exhaust pump coupled to the enclosure, a first purge gas port formed in the enclosure, a first channel operatively connected to the gas supply at a first end and to the first purge gas port at a second end, a second purge gas port formed in the enclosure, and a second channel operatively connected to the second purge gas port at a third end and to the exhaust pump at a fourth end. The first channel includes a particle filter, a heater, and a flow controller. The second channel comprises a dry scrubber.

In another embodiment, a semiconductor processing system is disclosed. The system includes a purge station and a Front Opening Unified Pod (FOUP) coupled to the purge station. The purge station includes an enclosure, a gas supply coupled to the enclosure, an exhaust pump coupled to the enclosure, a first purge gas port formed in the enclosure, a first channel operatively connected to the gas supply at a first end and to the first purge gas port at a second end, a second purge gas port formed in the enclosure and having a gas detector disposed therein, and a second channel operatively connected to the second purge gas port at a third end and to the exhaust pump at a fourth end. The first channel includes at least one of a particle filter, a heater, and a flow controller. The FOUP is operatively connected to the first purge gas port and to the second purge gas port and the FOUP comprises at least one horizontal substrate support.

In another embodiment, a semiconductor processing method is disclosed. The method includes (a) operatively connecting a Front Opening Unified Pod (FOUP) to a purge station having a purge gas inlet and a purge gas outlet separated by a divider; (b) disposing a semiconductor substrate in the FOUP; (c) supplying a purge gas to the FOUP via the purge gas inlet; and (d) passing the purge gas through the FOUP. The method further includes (e) removing the purge gas from the FOUP via the purge gas outlet; (f) measuring a toxic gas outgassing level after the purge gas is removed from the FOUP; and (g) flowing the purge gas through a dry scrubber after removing the purge gas from the FOUP via the purge gas outlet.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to an outgassing control system and methods for controlling outgassing such that hazardous gasses are eliminated from a surface of a substrate after an arsenic doped silicon process (Si:As) and prior to additional processing. The system includes a purge station having an enclosure, a gas supply coupled to the enclosure, an exhaust pump coupled to the enclosure, a first purge gas port formed in the enclosure, a first channel operatively connected to the gas supply at a first end and to the first purge gas port at a second end, a second purge gas port formed in the enclosure, and a second purge gas port operatively connected to the second purge gas port at a third end and to the exhaust pump at a fourth end. The first channel includes a heater for heating the purge gas, a particle filter, and/or a flow controller. The second channel includes a dry scrubber. It is observed that the outgassing is more effectively reduced when a heated purge gas is utilized. As such, hazardous gases and outgassing residuals are decreased and/or removed from the substrate such that further processing may be performed.

A "substrate" or "substrate surface," as described herein, generally refers to any substrate surface upon which processing is performed. For example, a substrate surface may include silicon, silicon oxide, doped silicon, silicon germanium, germanium, gallium arsenide, glass, sapphire, and any other materials, such as metals, metal nitrides, metal alloys, and other conductive or semi-conductive materials, depending on the application. A substrate or substrate surface may also include dielectric materials such as silicon dioxide, silicon nitride, organosilicates, and carbon dopes silicon oxide or nitride materials. The term "substrate" may further include the term "wafer." The substrate itself is not limited to any particular size or shape. Although the implementations described herein are generally made with reference to a round substrate, other shapes, such as polygonal, squared, rectangular, curved, or otherwise non-circular workpieces may be utilized according to the implementations described herein.

Figure 1:
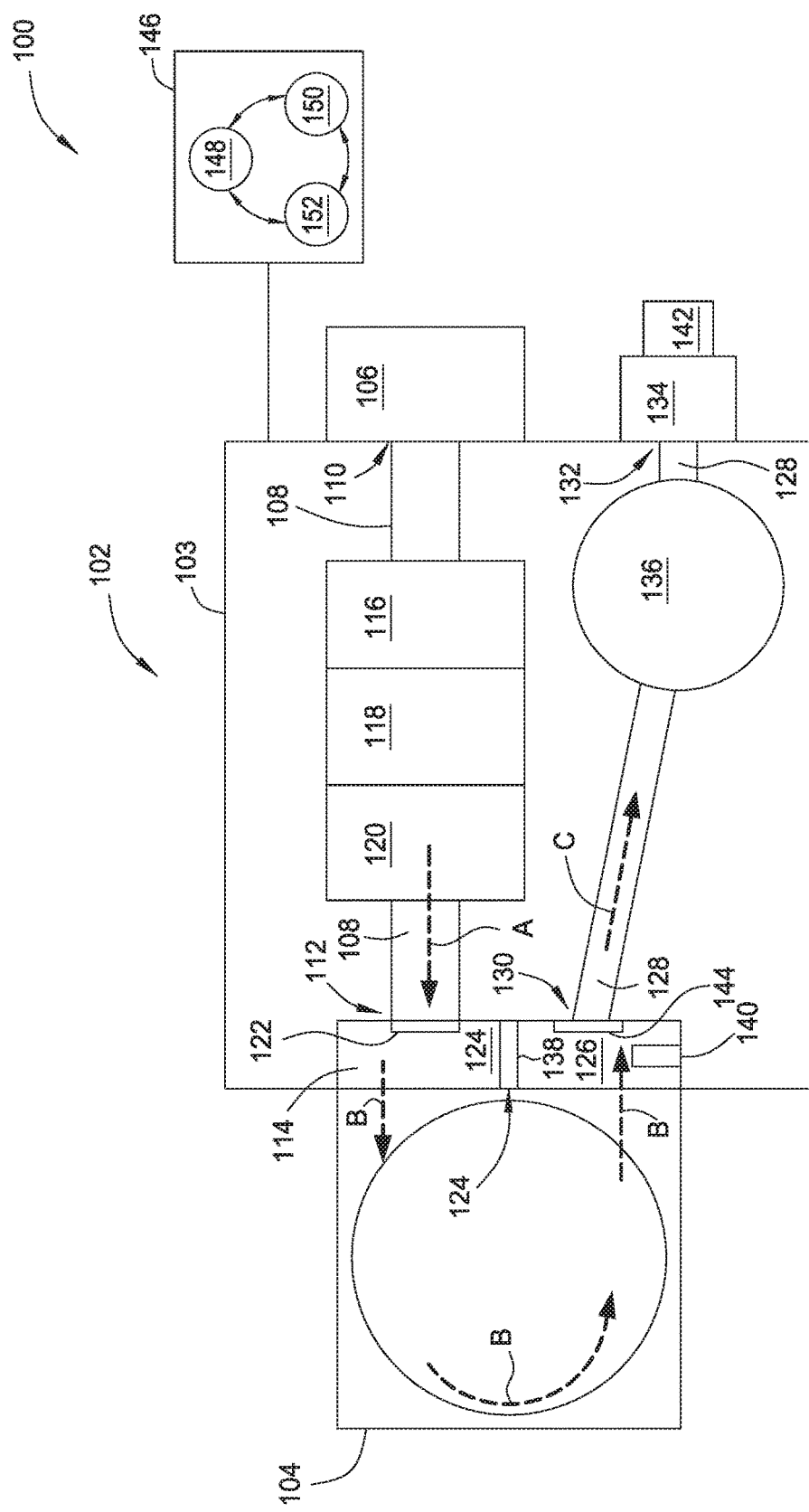
FIG. 1 schematically illustrates a top via of an outgassing control system, according to one embodiment.

FIG. 1 is a schematic top view of an outgassing control system 100. The outgassing control system 100 may be a standalone unit, thus being separate from a load lock chamber. In some embodiments, however, the outgassing control system 100 may be part of a cluster tool station, and, for example, utilized to increase throughput of an epitaxial tool.

The outgassing control system 100 includes a purge station 102 and a Front Opening Unified Pod (FOUP) 104. The FOUP 104 is an enclosure configured to hold a plurality of substrates securely and safely in a controlled environment. The FOUP may hold about 25 substrates, each in or on a substrate support disposed therein in a vertical orientation such that each substrate is relatively horizontal or flat on a major axis of the substrate. It is contemplated, however, that any number of substrates may be held in the FOUP. The FOUP 104 is portable thus allowing the substrates to be transferred between machines for processing or measurement. In some embodiments, the FOUP 104 may be coupled to the purge station 102. The FOUP 104, however, is transferred to the purge station 102 after processing of the substrates disposed inside the FOUP 104 has been completed.

The purge station 102 includes an enclosure 103 and a gas supply 106 coupled to the enclosure 103. In some embodiments, the gas supply 106 may be disposed in the purge station 102. In other embodiments, the gas supply 106 may be operatively connected to the purge station 102. The gas supply 106 may store and/or supply clean, dry air (CDA), oxygen, nitrogen, or an oxygen containing gas, among other suitable gases. In certain embodiments, the gas supply 106 may store and/or supply a gas comprising between about 10% oxygen and about 60% oxygen, such as a gas comprising about 20% oxygen.

A first channel 108 is operatively connected to the gas supply 106 at a first end 110 of the first channel 108. The first channel 108 is operatively connected to a first purge gas port 114 of the purge station 102 at a second end 112 of the first channel 108. The first purge gas port 114 is formed in the enclosure 103. The first channel 108 may be any suitable channel or tube for directing the flow of the purge gas from the gas supply 106 to the first purge gas port 114. The first channel 108 directs the flow of the purge gas from the gas supply 106 to the first purge gas port 114, as shown by reference arrows A in FIG. 1. After the purge gas flows from the gas supply to the first channel 108, the first channel 108 may direct the purge gas through a particle filter 116, a heater 118, and/or a flow controller 120 prior to directing the flow of the purge gas to the first purge gas port 114. In some embodiments, the first channel 108 may direct the purge gas through any one or more of the particle filter 116, the heater 118, and the flow controller 120. Further, in certain embodiments, the first channel 108 directs the purge gas through each of the particle filter 116, the heater 118, and the flow controller 120, the directing of which may occur in any order. In certain embodiments, however, the purge gas may be heated by the heater 118 after the purge gas has been filtered by the filter 116. In certain embodiments, the purge gas may first flow through the particle filter 116, followed by the heater 118, and ultimately flowing to the flow controller 120.

The particle filter 116 filters the purge gas at a rate between about 1 CFM and about 350 CFM, for example between about 200 CFM and about 300 CFM. The particle filter 116 may include pores therein of various sizes for filtering different sized particles.

The heater 118 heats the purge gas to a temperature between about 150 degrees Celsius and about 450 degrees Celsius, for example between about 200 degrees Celsius and about 400 degrees Celsius. In some embodiments, the heater 118 may be a coil heater, a heater jacket, or a resistively heated jacket. It is contemplated however that the heater 118 may be any suitable heating unit for heating a gas.

The flow controller 120 controls a flow rate of the purge gas. In some embodiments, the flow controller 120 further controls the oxygen level of the purge gas entering the first purge gas port 114 such that the oxygen level of the purge gas is between about 1% and about 40%, for example between about 1% and about 21% oxygen. In some implementations, the flow controller 120 dilutes and/or tunes the oxygen level of the purge gas by adding a second gas thereto. In some embodiments, the second gas may be a nitrogen gas or a nitrogen containing gas. The flow controller 120 may be a pneumatic flow meter, a manually adjustable flow meter, an electric flow meter, a mass flow controller, among others.

After directing the purge gas through the particle filter 116, the heater 118, and/or the flow controller 120 the first channel 108 directs the purge gas to the first purge gas port 114. A first valve 122 is disposed between the first channel 108 and the first purge gas port 114. The first valve 122 may be a gate valve, a pneumatic valve, a ball valve, or any other suitable open/close valve. The first purge gas port 114 is disposed adjacent a FOUP connection location 124. Upon opening of the first valve 122 the purge gas is directed into and/or enters into the FOUP 104.

A second purge gas port 126 is formed in the enclosure 103 and is further disposed adjacent the first purge gas port 114 at the FOUP connection location 124. The purge gas is directed to the second purge gas port 126 after passing through the FOUP 104. The second purge gas port 126 is operatively connected to a second channel 128 at a third end 130 of the second channel 128. The second channel 128 is substantially similar to the first channel 108, discussed supra. A second valve 144 is disposed between the second purge gas port 126 and the second channel 128. The second valve 144 may be a gate valve, a pneumatic valve, a ball valve, or any other suitable open/close valve. Upon opening of the second valve 144 the purge gas is directed into and/or enters into the second channel 128. The second channel 128 is also operatively connected to an exhaust pump 134 at a fourth end 132 of the second channel 128, wherein the fourth end 132 is opposite the third end 130. The exhaust pump 134 pumps the purge gas out of the second channel 128 and draws purge gas out of the FOUP 104. The second channel 128 comprises a dry scrubber 136. The dry scrubber 136 is disposed upstream of the second purge gas port 126. The dry scrubber 136 cleans the purge gas of toxic gases, such as arsenic. After passing through the dry scrubber 136, the purge gas continues in the second channel 128 to an exhaust 142. The second channel 128 directs the flow of the purge gas from the second purge gas port 126 to an exhaust 142, as shown by reference arrows C in FIG. 1.

The second purge gas port 126 includes a gas detector 140 disposed therein. The gas detector 140 is a toxic gas monitor or sensor which measures the concentration of toxic gases, such as arsenic. In some embodiments, the gas detector 140 may be an electrochemical sensor, an infrared sensor, a chemical detector, a chemical tape, or any other suitable gas sensor. In order to receive an accurate gas detection reading, a hot purge gas may be supplied into the FOUP 104 for a first time period, for example between about one minute and about eight minutes, for example five minutes. Subsequently, a room temperature nitrogen purge gas may be supplied to the FOUP 104 for approximately the same first time period. In some embodiments, the nitrogen purge gas may have a temperature higher or lower than room temperature. Subsequently, the purge gas flow is ceased and the gas detector measures the arsenic concentration.

A divider 138 is disposed between the first purge gas port 114 and the second purge gas port 126. In some embodiments, the divider 138 comprises a quartz material, a polytetrafluoroethylene material, a thermoplastic material, or the like. The divider is a non-metal material. The divider 138 influences the flow path of the purge gas from the first purge gas port 114 into the FOUP 104, as shown by reference arrows B in FIG. 1. The divider 138 prevents the purge gas from directly entering the second purge gas port 126 after being supplied to the FOUP 104 via the first purge gas port 114. As such, the divider 138 directs the purge gas through and/or around the inside of the FOUP 104 such that a substrate disposed in the FOUP 104 is exposed to the purge gas. The divider 138 extends outward from the purge station 102 towards the FOUP 104 such that upon coupling of the FOUP 104 to the purge station 102 the divider 138 is immediately next to an edge of the substrate, for example the divider is disposed between about 1mm and about 10mm from the edge of a substrate disposed inside the FOUP 104. The divider 138 extends vertically along each substrate disposed in the FOUP. In some embodiments, the divider 138 is oriented vertically and extends along at least one substrate support of the FOUP 104.

During operation of the purge station 102, both the first valve 122 and the second valve may be in an open position such that each of the first valve 122 and the second valve 144 are each open during operation of the purge station 102 as the operation may be a continuous process. With each of the first valve 122 and the second valve 144 open during operation of the purge station kinetic energy may allow for the purge gas to continuously flow through the purge station 102, including the FOUP 104, thus allowing for mechanical agitation of the substrates.

The outgassing control system 100 may also include a controller 146. The controller 146 facilitates the control and automation of the outgassing control system 100, including the purge station 102. The controller 146 may be coupled to or in communication with one or more of the purge station 102, the gas supply 106, the particle filter 116, the heater 118, the flow controller 120, the first valve 122, the second valve 144, the exhaust pump 134, the gas detector 140, the dry scrubber 136, and/or the exhaust 142. In some embodiments, the purge station 102 may provide information to the controller regarding substrate outgassing, purge gas flow, toxic gas levels, gas flow rates, gas temperatures, among other information.

The controller 146 may include a central processing unit (CPU) 148, memory 150, and support circuits (or I/O) 152. The CPU 148 may be one of any form of computer processors that are used in industrial settings for controlling various processes and hardware (e.g., pattern generators, motors, and other hardware) and monitor the processes (e.g., processing time and substrate position or location). The memory 150 is connected to the CPU 148, and may be one or more of a readily available memory, such as random access memory (RAM), read only memory (ROM), floppy disk, hard disk, or any other form of digital storage, local or remote. Software instructions and data can be coded and stored within the memory for instructing the CPU 148. The support circuits 152 are also connected to the CPU 148 for supporting the processor in a conventional manner. The support circuits 152 may include conventional cache, power supplies, clock circuits, input/output circuitry, subsystems, and the like. A program (or computer instructions) readable by the controller 146 implements the method described herein (infra) and/or determines which tasks are performable. The program may be software readable by the controller 146 and may include code to monitor and control, for example, the processing time and substrate outgassing or position within the FOUP 104.

In certain embodiments, the controller 146 may be a PC microcontroller. The controller 146 may also automate the sequence of the process performed by the outgassing control system 100, such that an outgassing reduction process is performed until a desired outgassing level is reached.

Figure 2:
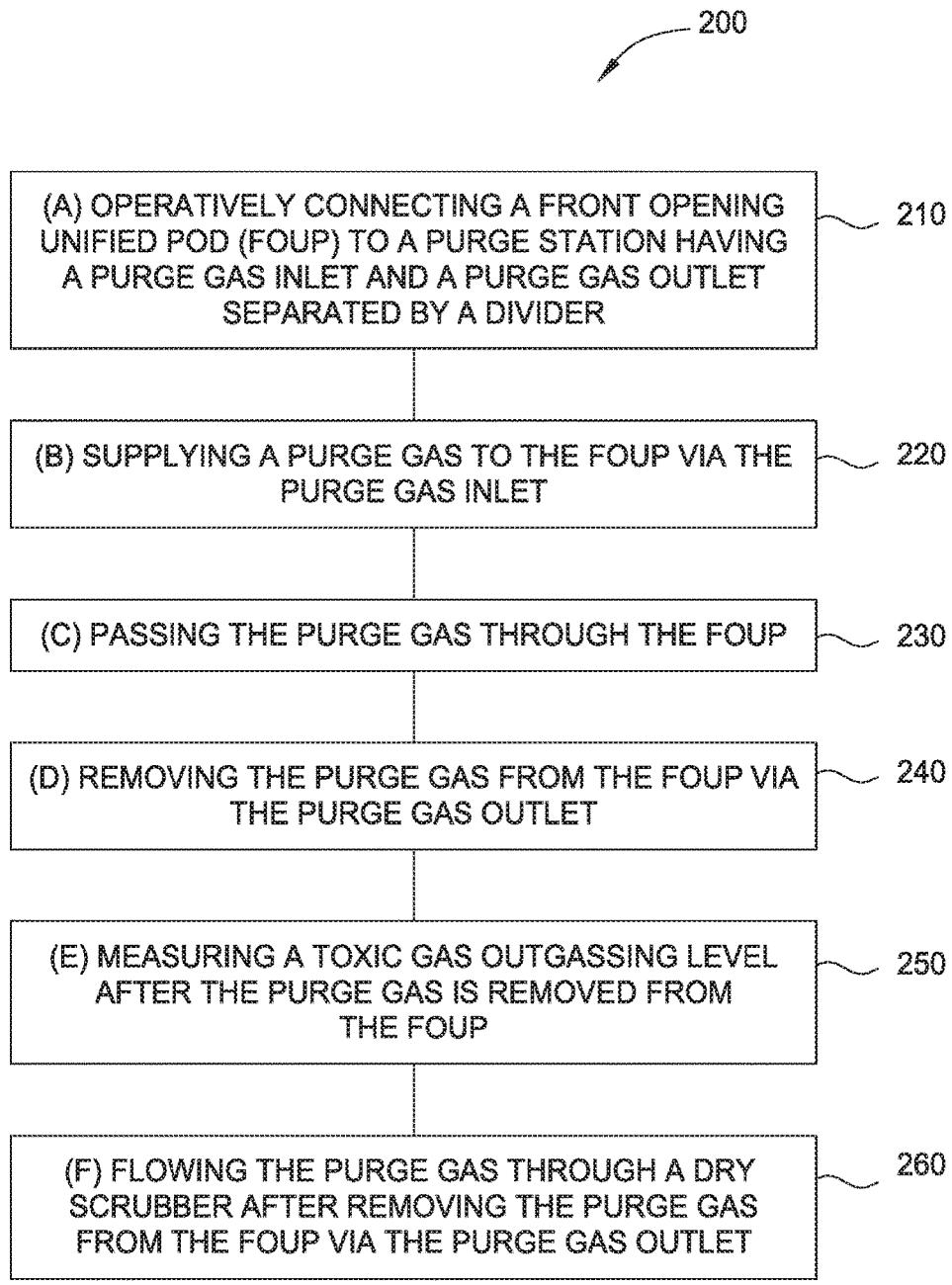
FIG. 2 illustrates a schematic flow diagram of a method for controlling outgassing, according to one embodiment.

FIG. 2 is a schematic flow diagram of a method 200 for controlling and reducing outgassing. Substrate outgassing generally relates to the releasing of gas or vapor product from the substrate or from a surface of the substrate. Controlling outgassing relating to the reduction and/or elimination of residual outgassed materials, for example, arsenic, from a substrate prior to transferring the substrate for downstream processing. In some embodiments, controller 146 facilitates the control and automation of the method 200.

At operation 210, a Front Opening Unified Pod (FOUP) is operatively connected to a purge station having a purge gas inlet and a purge gas outlet separated by a divider.

At operation 220, a purge gas is supplied to the FOUP via the purge gas inlet. The gas is supplied from a gas supply disposed upstream from the FOUP. The gas supply may hold more than one purge gas. In some embodiments, the purge gas may include clean dry air (CDA), an oxygen containing gas, or any other suitable purge gas. In certain embodiments, the purge gas is a gas comprising between about 10% oxygen and about 40% oxygen, such as air. In some embodiments, the gas supply may store an oxygen containing gas in a first storage unit and nitrogen containing gas in a second storage area. It is contemplated however, that the gas supply may also store other suitable purge gases.

Supplying the purge gas to the FOUP via the purge gas inlet includes directing the purge gas through a filter prior to entering the FOUP, directing the purge gas through heater prior to entering the FOUP, and/or directing the purge gas through a flow controller prior to entering the FOUP. The filter filters the purge such that unwanted particles are removed from the purge gas. The heater heats the purge gas to a temperature between about 30 degrees Celsius and about 100 degrees Celsius. The flow controller controls the flow of the purge gas to a flow rate between about 1 CFM and about 350 CFM.

At operation 230, the purge gas is passed through the FOUP. Passing the purge gas through the FOUP allows each substrate disposed in the FOUP to be exposed to the purge gas. In some embodiments, the purge gas may be clean dry air, or any other suitable oxygen containing gas. The exposure of the substrate to oxygen allows for the outgassing of toxic gases, such as arsenic, to be reduced to safe levels. Furthermore, the purge gas breaks down arsenic residuals to either stable oxides and/or byproducts which have a high vapor pressure, and therefore, evaporate quickly. As such, the deliberate pulsing and/or providing of an oxygen containing purge gas into the FOUP may remove arsenic in a controlled manner in order to appropriately abate the arsenic.

Furthermore, the flowing of an oxygen containing purge gas into the FOUP may allow for stable oxides to form on the surface of the substrate. Also, the oxygen containing purge gas may allow high vapor pressure byproducts may be removed from the substrate. Moreover, oxidation may have various effects on the substrate. The oxidation may break the bond of the arsenic species (for example between arsenic and OH groups) to carbon to form arsenic oxide which may leave the surface of the substrate more quickly.

At operation 240, the purge gas is removed from the FOUP via the purge gas outlet. The purge gas is removed from the FOUP by the use of an exhaust pump disposed downstream of the FOUP.

At operation 250, a toxic gas outgassing level is measured after the purge gas is removed from the FOUP. In some embodiments, a toxic gas outgassing level is measured by a gas detector. The gas detector monitors, senses, and/or measures the toxic gas outgassing level, for example, the concentration of arsenic therein. The gas detector may be an electrochemical sensor, a chemical detector, a chemical tape, an infrared sensor, or any other suitable sensor or detector.

At operation 260, the purge gas is flowed through a dry scrubber after removing the purge gas from the FOUP via the purge gas outlet. The dry scrubber cleans the exhausted purge gas of outgassing toxic gases, such as arsenic.

In certain embodiments, the a purge gas, such as CDA, is supplied into the FOUP for between about three minutes and about seven minutes, for example about five minutes. Subsequently, a nitrogen containing gas is supplied into the FOUP for between about three minutes and about seven minutes. After the CDA purge and the nitrogen purge are each complete, the purge is complete and a concentration of toxic gas (e.g., arsenic) is measured via the gas detector.

In some embodiments, operation 210, operation 220, operation 230, operation 240, operation 250, and/or operation 260 may be repeated for at least one additional cycle after an initial completion of operation 260. By repeating the flowing of the purge gas into the FOUP, ceasing the flow of the purge gas into the FOUP, and/or removing the purge gas from the FOUP, outgassing is further driven down towards the zero ppb level. Testing has been completed and results indicate that exposure of a substrate disposed in a FOUP after a Si:As process, outgassing is reduced to zero ppb after exposure to heated CDA.

Figure 3:
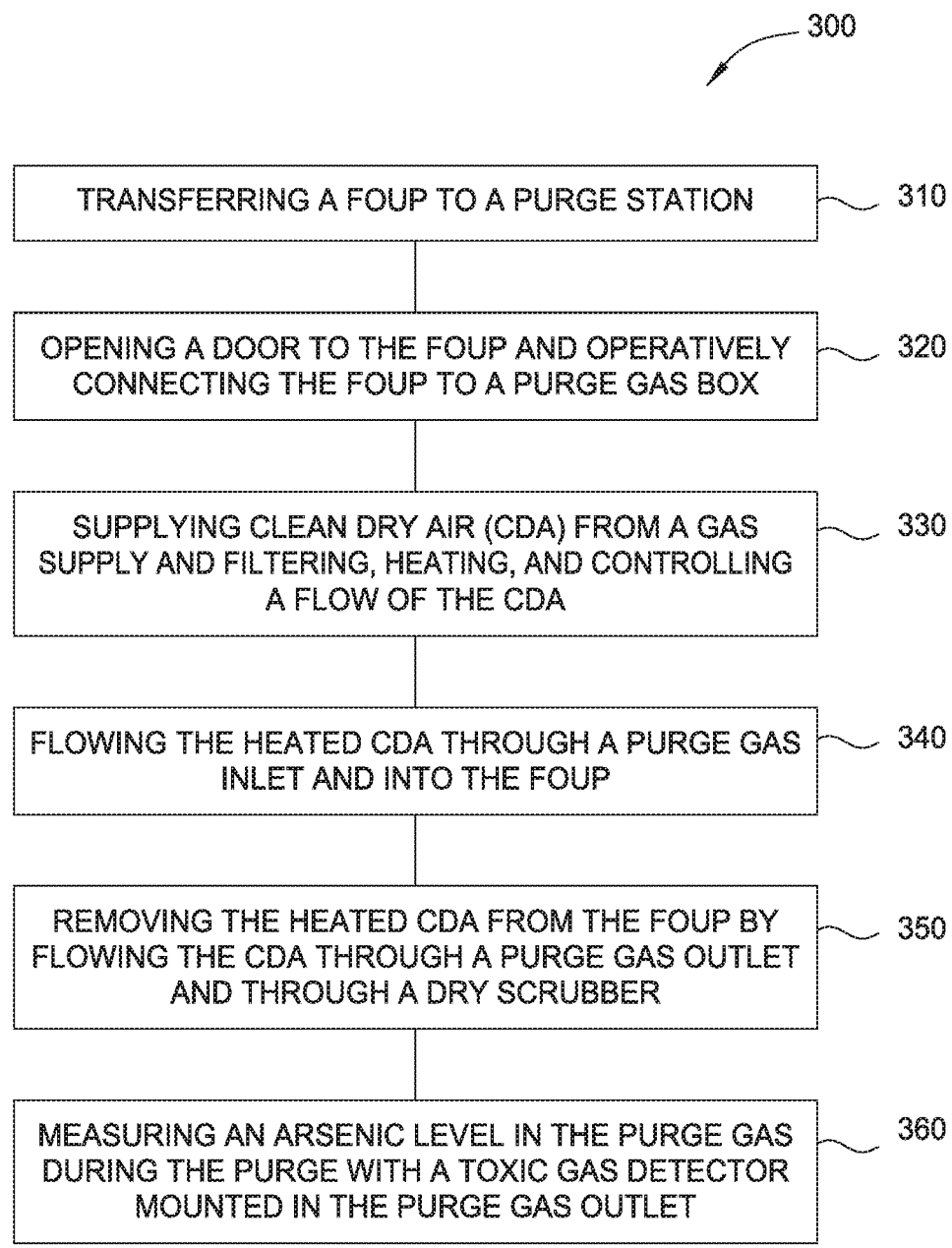
FIG. 3 illustrates a schematic flow diagram of a method for controlling outgassing, according to one embodiment.

FIG. 3 is a schematic flow diagram of a method 300 for controlling and reducing outgassing. In some embodiments, controller 146 facilitates the control and automation of the method 300.

At operation 310, a FOUP is transferred to a purge station. The FOUP may comprise one or more substrates therein.

At operation 320, a door to the FOUP is opened and the FOUP is operatively connected to a purge gas box. The FOUP is operatively connected to the purge gas box at the door of the FOUP such that the opened door is adjacent the purge gas box. The purge gas box is divided into two channels such that the purge gas box includes a purge gas inlet and a purge gas outlet each separated by a divider.

At operation 330, clean dry air (CDA) is supplied from a gas supply and is filtered, heated, and controlled by a flow controller. In some embodiments, the CDA is heated to a temperature between about 30 degrees Celsius and about 100 degree Celsius, for example, a temperature between about 50 degrees Celsius and about 80 degrees Celsius. In some embodiments the CDA is controlled by the flow controller to a flow rate between about 1 CFM and about 350 CFM, for example between about 1 CFM and about 100 CFM.

At operation 340, the heated CDA is flowed through the purge box inlet into the FOUP. At operation 350, the heated CDA is removed from the FOUP by flowing the CDA through the purge gas outlet and through a dry scrubber. At operation 360, a toxic gas detector mounted in the purge gas outlet measures the arsenic level in the purge gas during the purge. It is also contemplated that the toxic gas detector may also measure arsenic levels when a purge gas is not present in the purge gas outlet. In certain embodiments, the method 300 is repeated until outgassing levels drop to zero parts per billion.

Benefits of the present disclosure include improved substrate throughput, as well as substrates in which residual arsenic outgassing gasses are eliminated before further processing. Furthermore, fume hoods are not necessary to control outgassing. Outgassing is controlled and removed prior to subsequent processes between chambers and/or tools.

Additional benefits include reduced contaminations and cross-contaminations. Also, the present disclosure may be applied to all arsenic and/or phosphate implantations.

To summarize, the embodiments disclosed herein relate to apparatus and methods for controlling substrate outgassing such that hazardous gasses are eliminated from a surface of a substrate after a Si:As process has been performed on a substrate, and prior to additional processing. A heated purge gas, generally an oxygen containing gas, is flowed to a substrate disposed in a FOUP. A toxic gas detector continuously measures arsenic level during the purge as well as before or after the purge. As such, hazardous gases and outgassing residuals are decreased and/or removed from the substrate such that further processing may be performed.

While the foregoing is directed to embodiments of the present disclosure, other and further embodiments of the disclosure may be devised without departing from the basic scope thereof, and the scope thereof is determined by the claims that follow.

What is claimed is:

1. A semiconductor processing system, comprising:
   a purge station, comprising:
      an enclosure;
      a gas supply coupled to the enclosure;
      an exhaust pump coupled to the enclosure;
      a first purge gas port formed in the enclosure;
      a first channel operatively connected to the gas supply at a first end and to the first purge gas port at a second end, wherein the first channel comprises:
         a particle filter;
         a heater; and
         a flow controller;
      a second purge gas port formed in the enclosure; and
      a second channel operatively connected to the second purge gas port at a third end and to the exhaust pump at a fourth end, wherein the second channel comprises a dry scrubber.

2. The semiconductor processing system of claim 1, further comprising a divider disposed between the first purge gas port and the second purge gas port.

3. The semiconductor processing system of claim 2, wherein the divider comprises a quartz material, a polytetrafluoroethylene material, or a thermoplastic material.

4. The semiconductor processing system of claim 1, further comprising a first valve disposed between the first channel and the first purge gas port and a second valve disposed between the second purge gas port and the second channel.

5. The semiconductor processing system of claim 1, further comprising a Front Opening Unified Pod (FOUP) coupled to an outside of the purge station.

6. The semiconductor processing system of claim 5, wherein the FOUP is operatively connected to the first purge gas port and to the second purge gas port.

7. The semiconductor processing system of claim 5, further comprising a non-metal divider disposed between the first purge gas port and the second purge gas port, wherein the FOUP comprises at least one substrate support disposed horizontally therein, and wherein the divider is oriented vertically and extends along the at least one substrate support.

8. The semiconductor processing system of claim 7, wherein the divider comprises a quartz material, a polytetrafluoroethylene material, or a thermoplastic material.

9. The semiconductor processing system of claim 1, further comprising:
   a gas detector disposed within the second purge gas port.

10. The semiconductor processing system of claim 1, further comprising:
    a controller operatively connected to the purge station to control operation of the gas supply, the heater, the flow controller, the exhaust pump, and the dry scrubber.

11. A semiconductor processing system, comprising:
    a purge station, comprising:
       an enclosure;
       a gas supply coupled to the enclosure;
       an exhaust pump coupled to the enclosure;
       a first purge gas port formed in the enclosure;
       a first channel operatively connected to the gas supply at a first end and to the first purge gas port at a second end, wherein the first channel comprises at least one of:
          a particle filter;
          a heater; and
          a flow controller;
       a second purge gas port formed in the enclosure and having a gas detector disposed therein;
       a second channel operatively connected to the second purge gas port at a third end and to the exhaust pump at a fourth end; and
    a Front Opening Unified Pod (FOUP) coupled to the purge station, wherein the FOUP is operatively connected to the first purge gas port and to the second purge gas port and the FOUP comprises at least one horizontal substrate support.

12. The semiconductor processing system of claim 11, wherein the second channel comprises a dry scrubber.

13. The semiconductor processing system of claim 11, further comprising a divider disposed between the first purge gas port and the second purge gas port.

14. The semiconductor processing system of claim 13, wherein the divider comprises a quartz material, a polytetrafluoroethylene material, or a thermoplastic material.

15. The semiconductor processing system of claim 11, further comprising a first valve disposed between the first channel and the first purge gas port and a second valve disposed between the second purge gas port and the second channel.

16. The semiconductor processing system of claim 11, further comprising:
    a controller operatively connected to the purge station to control operation of the gas supply, the heater, the flow controller, and the exhaust pump.

17. A semiconductor processing method, comprising:
    (a) operatively connecting a Front Opening Unified Pod (FOUP) to a purge station having a purge gas inlet and a purge gas outlet separated by a divider;
    (b) disposing a semiconductor substrate in the FOUP;
    (c) supplying a purge gas to the FOUP via the purge gas inlet;
    (d) passing the purge gas through the FOUP;
    (e) removing the purge gas from the FOUP via the purge gas outlet;
    (f) measuring a toxic gas outgassing level after the purge gas is removed from the FOUP; and
    (g) flowing the purge gas through a dry scrubber after removing the purge gas from the FOUP.

18. The method of claim 17, wherein the supplying the purge gas further includes:
    directing the purge gas through a filter prior to entering the FOUP;
    directing the purge gas through a heater prior to entering the FOUP; and directing the purge gas through a flow controller prior to entering the FOUP.

19. The method of claim 18, wherein the directing the purge gas through the heater prior to entering the FOUP heats the purge gas to a temperature between about 30 degrees Celsius and about 100 degrees Celsius.

20. The method of claim 18, wherein the directing the purge gas through a flow controller prior to entering the FOUP controls the flow of the purge gas to a flow rate between about 1 CFM and about 350 CFM.

* * * * *